United States Patent
Park

(10) Patent No.: US 8,227,881 B2
(45) Date of Patent: Jul. 24, 2012

(54) SOLAR CELL AND ITS METHOD OF MANUFACTURE

(75) Inventor: Sang-Wook Park, Suwon-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 373 days.

(21) Appl. No.: 11/730,131

(22) Filed: Mar. 29, 2007

(65) Prior Publication Data

US 2007/0238216 A1    Oct. 11, 2007

(30) Foreign Application Priority Data

Apr. 5, 2006   (KR) .................. 10-2006-0031126

(51) Int. Cl.
     *H01L 27/14*      (2006.01)
(52) U.S. Cl. ............... 257/431; 257/461; 257/E25.007
(58) Field of Classification Search .......... 257/E25.007, 257/431, 461
See application file for complete search history.

(56) References Cited

U.S. PATENT DOCUMENTS

| | | | |
|---|---|---|---|
| 5,270,248 A | | 12/1993 | Rosenblum et al. |
| 5,421,909 A | * | 6/1995 | Ishikawa et al. ............. 136/256 |
| 2005/0109238 A1 | * | 5/2005 | Yamaki et al. ............ 106/287.16 |
| 2006/0162770 A1 | * | 7/2006 | Matsui et al. .................. 136/263 |

FOREIGN PATENT DOCUMENTS

| | | |
|---|---|---|
| JP | 06-104463 | 4/1994 |
| JP | 06097491 A * | 4/1994 |
| JP | 06-169097 | 6/1994 |
| JP | 06-310741 | 11/1994 |
| JP | 09-172196 | 6/1997 |
| JP | 2003-229589 | 8/2003 |
| JP | 2003-229589 A | 8/2003 |
| JP | 2005-259859 | 9/2005 |
| KR | 1019930015136 | 7/1993 |
| WO | 01/24279 A1 | 4/2001 |
| WO | 2007/082760 A1 | 7/2007 |

OTHER PUBLICATIONS

Extended European Search Report issued by EPO, dated Feb. 22, 2011, corresponding to European Patent Application No. 07105713.7-2203/1843398.

Stalmans L et al: "Low-thermal-budget treatements of porous silicon surface layers on crystalline Si solar cells: A way to go for improved surface passivation?", Solar Energy Materials and Solar Cells, Elsevier Science Publishers, Amsterdam, NL NKD-DOI: 10. 1016/S0927-0248 (98) 00207-4, vol. 58, No. 3, Jul. 15, 1999, pp. 237-252, XP004179795 which was cited in the Extended European Search Report issued by EPO, dated Feb. 22, 2011, corresponding to European Patent Application No. 07105713.7-2203/1843398.

(Continued)

*Primary Examiner* — Kenneth Parker
*Assistant Examiner* — Jose R Diaz
(74) *Attorney, Agent, or Firm* — Robert E. Bushnell

(57) ABSTRACT

A solar cell having improved efficiency and its method of manufacture includes: forming a porous layer on a surface of a semiconductor substrate; spraying a compound containing a dopant on the porous layer; and forming an emitter layer on the surface of the semiconductor substrate by diffusing the dopant.

11 Claims, 6 Drawing Sheets

OTHER PUBLICATIONS

Bilyalov R R et al: "Multicrystalline silicon solar cells with porous silicon emitter", Solar Energy Materials and Solar Cells, Elsevier Science Publishers, Amsterdam, NL, vol. 60, No. 4, Feb. 1, 2000, pp. 391-420, XP004244741 which was cited in the Extended European Search Report issued by EPO, dated Feb. 22, 2011, corresponding to European Patent Application No. 07105713.7-2203/1843398.

European Search Report issued by European Patent Office on Nov. 9, 2010 corresponding to Korean Patent Application No. 2006-0031126.

Bentzen A et al: "Correspondence between sheet resistance and emitter profile of phoshorus diffused emitters from a spray-on dopant" Conference Record of the Thirty-First IEEE Photovoltaic Specialist Conference (IEEE CAT. No. 05CH37608) IEEE Piscataway, NJ, USA, Jan. 3, 2005, pp. 1153-1156, XP010824096.

K. Drabczyk et al., "The Influence of Porous Silicon on Junction Formation in Silicon Solar Cells", Solar Energy Materials & Solar Cells, 2003, vol. 76, No. 4, pp. 545-551.

Request for Entry of the Accompanying Office Action for Japanese Office Action attached herewith.

Office action from Japanese Patent Office issued in Applicant's corresponding Japanese Patent Application No. 2007-067884 dated Nov. 24, 2009.

Ludemann et al., Novel Processing of Solar Cells with Porous Silicon Texturing, Photovoltaic Specialists Conference (2000) pp. 299-302.

Korean Office Action issued Jun. 5, 2012 in connection with Korean Patent Application No. 10-2006-0031126 and Request for Entry of the Accompanying Office Action attached herewith.

* cited by examiner

SOLAR CELL AND ITS METHOD OF MANUFACTURE

CLAIM OF PRIORITY

This application makes reference to, incorporates the same herein, and claims all benefits accruing under 35 U.S.C. §119 from an application for SOLAR CELL AND METHOD OF MANUFACTURING THE SAME earlier filed in the Korean Intellectual Property Office on the 5 th day of Apr. 2006 and there duly assigned Serial No. 10-2006-0031126.

BACKGROUND OF THE INVENTION

1. Field of the Invention

The present invention relates to a solar cell and its method of manufacture, and more particularly, the present invention relates to a solar cell having improved efficiency and its method of manufacture.

2. Description of the Related Art

A solar cell generates electric energy using solar energy. The solar cell is eco-friendly and has an infinite energy source and a long life span. The solar cell includes a silicon solar cell and a dye-sensitized solar cell.

The silicon solar cell includes a semiconductor substrate and an emitter layer that have different conductivity types to form a PN junction, a first electrode electrically connected to the emitter layer, and a second electrode electrically connected to the semiconductor substrate.

In general, the emitter layer is formed by a high-temperature diffusion method, a printing method or a spray method. Since the high-temperature diffusion method uses a diffusion furnace, the high-temperature diffusion method has poor productivity and is not suitable for a large-sized device. Since the printing method uses an expensive material, the printing method has a large material loss and poor productivity. In the spray method, a compound containing a dopant is sprayed onto a surface of the semiconductor substrate and the dopant is diffused by a high-temperature heating treatment, thereby forming the emitter layer. The spray method has better productivity than the other methods.

However, while the compound containing the dopant that is used in the spray method is hydrophilic, the semiconductor substrate is hydrophobic. Accordingly, the compound containing the dopant cannot be formed on the semiconductor substrate with certainty. In addition, since the compound containing the dopant is vaporized in the high-temperature heating treatment, a sufficient amount of dopant cannot be diffused into the semiconductor substrate. Therefore, since it is difficult to form the emitter layer having an appropriate concentration, PN junction characteristics deteriorate.

SUMMARY OF THE INVENTION

In order to solve the aforementioned problem, the present invention provides a solar cell which can diffuse a sufficient amount of dopant into a semiconductor substrate to improve PN junction characteristics and its method of manufacture.

According to one aspect of the present invention, a method of manufacturing a solar cell is provided, the method including: forming a porous layer on a surface of a semiconductor substrate; spraying a compound containing a dopant on the porous layer; and forming an emitter layer on the surface of the semiconductor substrate by diffusing the dopant.

The dopant may be diffused from the porous layer to the semiconductor substrate by a heat treatment.

The porous layer may be formed by performing a chemical treatment on the surface of the semiconductor substrate. The porous layer may be formed of the same material as that of the semiconductor substrate. The chemical treatment may be a hydrofluoric acid treatment. The porous layer may include silicon.

The porous layer may be formed by a deposition method or a printing method. The porous layer may include at least one material selected from a group consisting of titanium oxide, silicon oxide and silicon nitride.

The method may further include removing the porous layer after forming the emitter layer.

According to another aspect of the present invention, a solar cell is provided including: a semiconductor substrate; an emitter layer arranged on a surface of the semiconductor substrate; and a porous layer arranged on the emitter layer to prevent solar light from being reflected.

The porous layer and the emitter layer may be formed of a same material. The porous layer may include silicon. When the porous layer is formed of silicon, a porous layer having a different energy band gap and a light region can be used. However, a porous layer having a different energy band gap and a light region cannot be used in the existing silicon solar cell.

The porous layer and the emitter layer maybe formed of different materials. The porous layer may include at least one material selected from a group consisting of titanium oxide, silicon oxide and silicon nitride.

The solar cell may further include a first electrode electrically connected to the emitter layer and a second electrode electrically connected to the semiconductor substrate.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Hereinafter, a solar cell and its method of manufacture according to embodiments of the present invention are described in detail below with reference to the attached drawings.

FIGS. 1A to 1F are cross-sectional views of a method of manufacturing a solar cell according to an embodiment of the present invention.

Figure 1A:
FIGS. 1A to 1F are cross-sectional views of a method of manufacturing a solar cell according to an embodiment of the present invention.

First, as shown in FIG. 1A, a p-type semiconductor substrate 10 is formed of silicon. However, the present invention is not limited thereto. That is, an n-type semiconductor substrate or a semiconductor substrate formed of various semiconductor materials other than silicon may be used.

In order to improve the characteristics of the solar cell, a preprocessing step may be performed. The preprocessing step is performed by etching the semiconductor substrate 10 using an alkali aqueous solution or a mixed acid solution and removing impurities. A damaged portion of the semiconductor substrate 10 is removed by the etching and fine irregularities are formed in the surface of the semiconductor substrate 10. Accordingly, it is possible to reduce the loss of solar light.

Figure 1B:
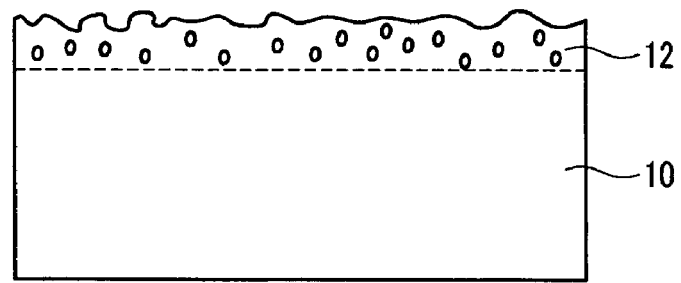

Subsequently, as shown in FIG. 1B, a porous layer 12 is formed on a surface of the semiconductor substrate 10. In the present embodiment, the porous layer 12 is formed on the surface of the semiconductor substrate 10 by a chemical treatment. Such a chemical treatment includes a hydrofluoric acid treatment. However, the present invention is not limited thereto. The porous layer may be formed by other various methods.

The porous layer 12 is formed of the substantially same material as that of the semiconductor substrate 10. However, since the porous layer 12 is formed of porous silicon unlike the semiconductor substrate 10, the porous layer 12 has an energy band gap different from that of the semiconductor substrate 10.

Figure 1C:
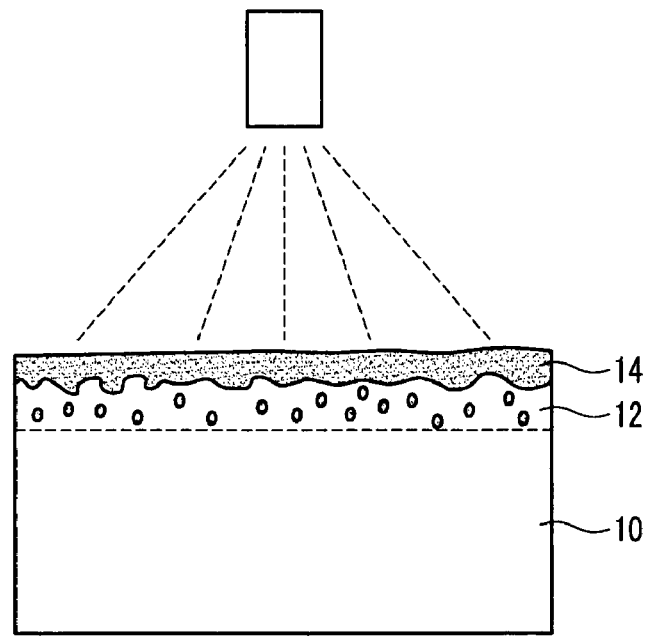
Figure 1D:
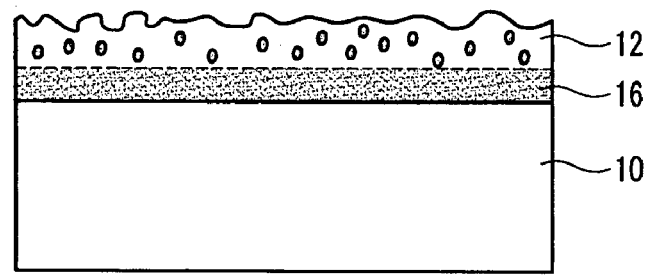

Subsequently, as shown in FIGS. 1C and 1D, an emitter layer 16 is formed on the surface of the semiconductor substrate 10, and more particularly, on a boundary between the porous layer 12 and the semiconductor substrate 10.

As shown in FIG. 1C, a phosphorus containing compound 14 is sprayed onto the porous layer 12 by a spray method.

The phosphorous containing compound 14 sprayed onto the porous layer 12 is stored in the surface and the pores of the porous layer 12. Accordingly, even when the semiconductor substrate 10 is hydrophobic, a sufficient amount of phosphorous containing compound 14 can be stored in the porous layer 12.

Although phosphorous is used as the dopant to form the n-type emitter layer 16 in the present embodiment, the present invention is not limited thereto and various materials other than phosphorous may be used as the dopant. The conductivity of the emitter layer 16 must be opposite to that of the semiconductor substrate 10. Accordingly, when an n-type semiconductor substrate is used, a p-type emitter layer must be formed.

Next, as shown in FIG. 1 D, phosphorous is diffused from the porous layer to the semiconductor substrate 10 by a high-temperature heating treatment to form the n-type emitter layer 16. The high-temperature heating treatment may be performed using an infrared lamp or various other methods. Since phosphorous remains in the porous layer 12, the porous layer 12 is formed of substantially the same material as that of the emitter layer 16. That is, the porous layer 12 is formed of silicon doped with phosphorous.

In the present embodiment, since a sufficient amount of phosphorous containing compound is stored in the porous layer 12, it is possible to diffuse a large amount of dopant into the semiconductor substrate 10. Since the porous layer 12 formed on the front surface of the semiconductor substrate 10 prevents the phosphorous containing compound 14 from being vaporized during the high-temperature heating treatment, it is possible to increase the amount of the dopant diffused into the semiconductor substrate 10. Accordingly, it is possible to form the emitter layer 16 so as to have a desired concentration and to improve PN junction characteristics.

Since the spray method is used in the present embodiment, it is possible to form the emitter layer 16 only on the front surface of the semiconductor substrate 10. That is, it is possible to simplify the process, as compared with a high-temperature diffusion method which requires the step of disconnecting the emitter layers formed on the front surface and the rear surface of the semiconductor substrate because the emitter layer is formed on the front surface, the side surface and the rear surface of the semiconductor substrate. In the spray method, a compensation process for removing the emitter layer formed on the rear surface is unnecessary and the present embodiment is applicable to solar cells having various rear structures.

Figure 1E:
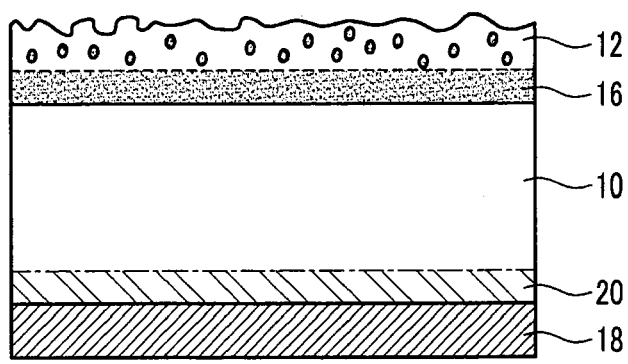

Subsequently, as shown in FIG. 1E, an aluminum paste is screen-printed on the rear surface of the semiconductor substrate 10 and is heated to form a rear electrode 18, which is electrically connected to the semiconductor substrate 10. However, the present invention is not limited thereto. The rear electrode 18 maybe formed of various materials and such a modification is within the scope of the present invention.

Aluminum is diffused into the rear surface of the semiconductor substrate 10 to a predetermined thickness by the heating treatment to form a p+ rear field layer 20. The rear field layer 20 prevents photoexcited electrons from moving to the rear surface of the semiconductor substrate 10.

Figure 1F:
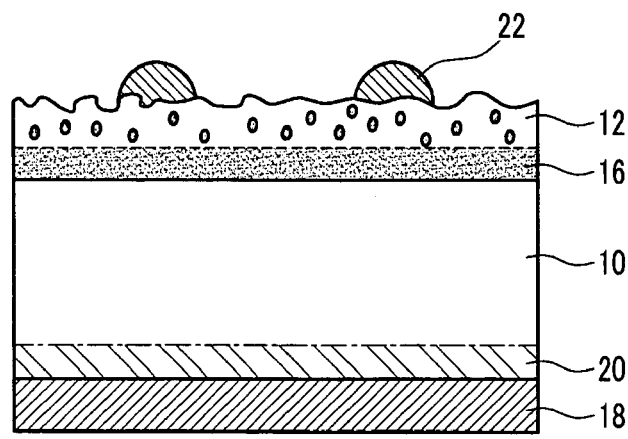

Subsequently, as shown in FIG. 1F, a front electrode 22, which is electrically connected to the emitter layer 16, is formed on the porous layer 12. The front electrode 22 may be formed by coating the porous layer 12 with a conductive paste in a predetermined pattern and performing a heating treatment. The conductive paste may be, for example, formed of silver (Ag). As described above, since the dopant remains in the porous layer 12 even after the dopant is diffused into the emitter layer 16, the porous layer 12 and the emitter layer 15 are formed of substantially the same material. Accordingly, although the front electrode 22 is formed on the porous layer 12, the front electrode 22 and the emitter layer 16 can be electrically connected to each other.

The solar cell manufactured by the above-described manufacturing method includes the semiconductor substrate 10, the emitter layer 16 formed on the front surface of the semiconductor substrate 10, the porous layer 12, the front electrode 22 and the rear electrode 18 formed on the rear surface of the semiconductor substrate 10. The porous layer 12 is formed of porous silicon.

Since the energy band gap of the non-porous silicon of the semiconductor substrate 10 and the emitter layer 16 is different from that of the porous silicon of the porous layer 12, it is possible to use solar light of a short-wavelength region which cannot be conventionally used. Accordingly, it is possible to remarkably increase the use ratio of the solar light.

It is possible to decrease reflectivity of the front surface to about 1% by the texturing the porous layer 12 and to improve the light receiving efficiency of the solar cell. Since the porous layer 12 has reflection preventing effect in the present embodiment, an additional reflection preventing layer may not be needed. If necessary, the reflection preventing layer may be formed and such a modification is within the scope of the present invention.

Hereinafter, a solar cell and its method of manufacture according to another embodiment of the present invention is described in detail below with reference to the attached drawings. A detailed description on same or similar steps as those of the above-described embodiment have been omitted.

FIGS. 2A to 2F are cross-sectional views of a method of manufacturing a solar cell according to another embodiment of the present invention.

Figure 2A:
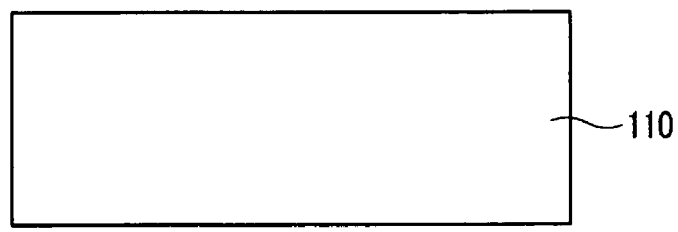
FIGS. 2A to 2F are cross-sectional views of a method of manufacturing a solar cell according to another embodiment of the present invention.

First, as shown in FIG. 2A, a p-type semiconductor substrate 110 is formed of silicon.

Figure 2B:
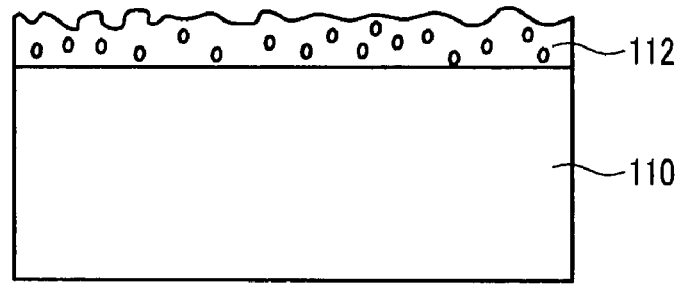

Subsequently, as shown in FIG. 2B, a porous layer 112 is formed on a surface of the semiconductor substrate 110 by a deposition method or a printing method. The porous layer 112 may be titanium oxide, silicon oxide or silicon nitride. Since the porous layer 112 is formed of a different material from that of the semiconductor substrate 110, the porous layer 112 is formed of a different material from that of an emitter layer, which will be described later.

Figure 2C:
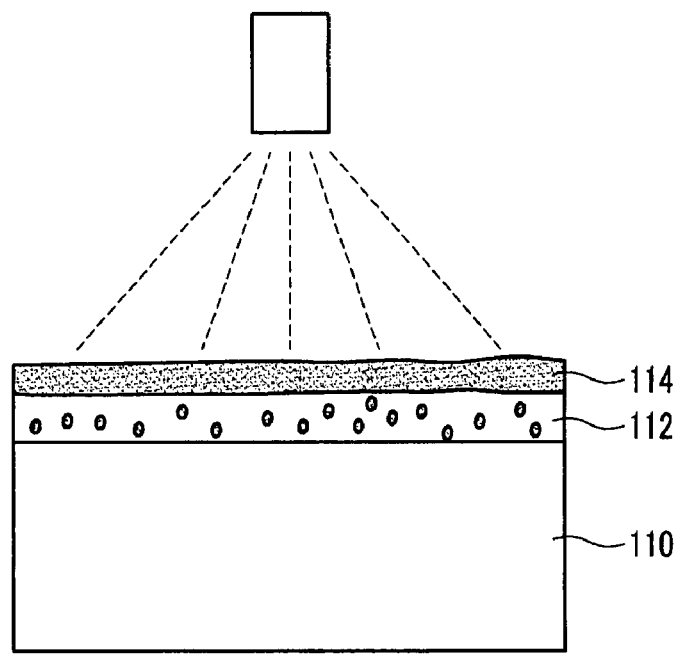
Figure 2D:
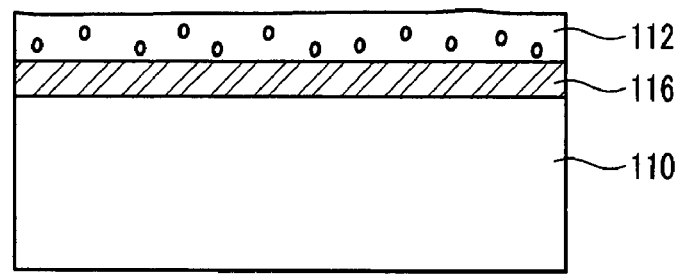

Subsequently, as shown in FIGS. 2C and 2D, an emitter layer 116 is formed on the surface of the semiconductor substrate 110, and more particularly, on a boundary between the porous layer 112 and the semiconductor substrate 110.

That is, as shown in FIG. 2C, a phosphorus containing 114 compound is sprayed onto the porous layer 112 by a spray method. Then, as shown in FIG. 2D, phosphorus is diffused by a high-temperature heating treatment to form the n-emitter layer 116. However, the present invention is not limited thereto and various materials other than phosphorus may be used as the dopant.

In the present embodiment, the density of the porous layer 112 is increased by the high-temperature heating treatment and thus the porous layer 112 can function as a reflection preventing layer.

Figure 2E:
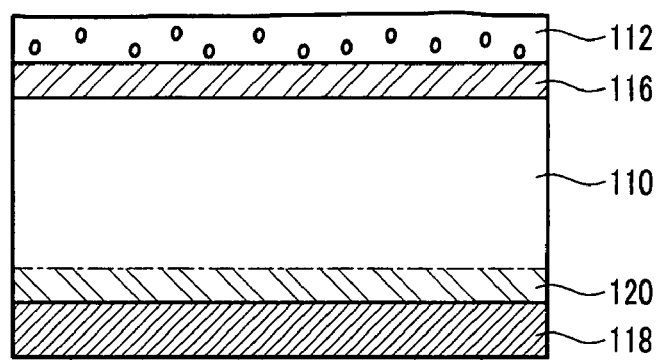

Subsequently, as shown in FIG. 2E, a rear electrode 118 and a rear field layer 120 are formed on a rear surface of the semiconductor substrate 110.

Figure 2F:
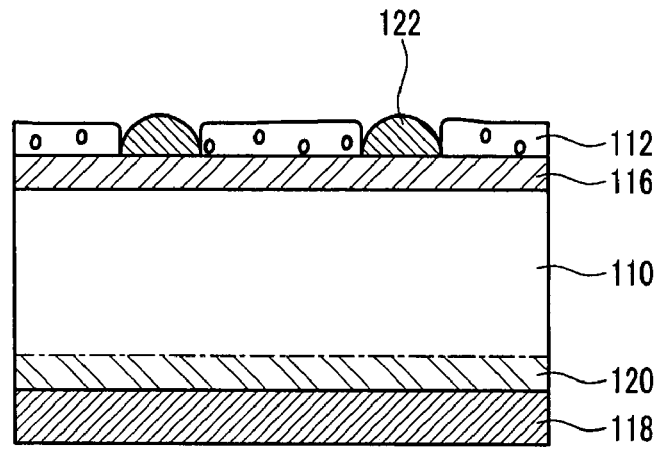

Subsequently, as shown in FIG. 2F, a front electrode 122, which is electrically connected to the emitter layer 116, is formed. The front electrode 122 may be formed by coating the porous layer 112 with a paste containing a conductive paste, such as a paste containing silver in a predetermined pattern, and performing a heating treatment. Since the porous layer 112 positioned below the conductive paste is removed during the heating treatment, the front electrode 122 and the emitter layer 116 are brought into contact with each other and thus the front electrode 122 and the emitter layer 116 are electrically connected to each other.

In the solar cell manufactured by the above-described manufacturing method, the porous layer 112 is formed of the different material from that of the semiconductor substrate 110 and the emitter layer 116 and functions as the reflection preventing layer. That is, since the porous layer 112 improves PN junction characteristics and functions as the reflection preventing layer, the reflection preventing layer need not be separately formed and thus the method can be simplified.

Although the porous layer functions as the reflection preventing layer in the above-described embodiment, the porous layer may be removed after forming the emitter layer and such a modification is within the scope of the present invention.

That is, although the exemplary embodiments and the modified examples of the present invention have been described, the present invention is not limited to the embodiments and examples, but may be modified in various forms without departing from the scope of the appended claims. Therefore, it is natural that such modifications belong to the scope of the present invention.

According to a method of manufacturing a solar cell according to the present invention, a porous layer can store a sufficient amount of dopant containing compound and prevent the dopant containing compound from being vaporized upon a high-temperature heating treatment to diffuse a sufficient amount of dopant into a semiconductor substrate. Accordingly, it is possible to form an emitter portion having an appropriate concentration and to improve PN junction characteristics to manufacture an improved solar cell.

In addition, since a spray method is used in forming the emitter layer, it is possible to simplify the method and improve productivity. Therefore, it is possible to manufacture solar cells having various rear structures.

According to a solar cell of the present invention, since a porous layer can be formed to use light of a short-wavelength region, it is possible to remarkably increase the use ratio of solar light and to prevent the solar light from being reflected. Therefore, it is possible to improve the efficiency of the solar cell.

What is claimed is:

1. A solar cell comprising:
    a semiconductor substrate;
    an emitter layer arranged on a surface of the semiconductor substrate; and
    a porous layer arranged on the emitter layer to prevent solar light from being reflected having a closed surface structure and uniform thickness, said closed surface structure has no openings or cavities on or to any surface of the porous layer; and
    a first electrode positioned on the porous layer on a side of the porous layer opposite to that of the emitter layer,
    wherein said porous layer contains a plurality of spherical structures uniformly distributed only in an interior space of the porous layer.

2. The solar cell of claim 1, wherein the porous layer and the emitter layer are of a same material.

3. The solar cell of claim 2, wherein the porous layer includes silicon.

4. The solar cell of claim 1, wherein the porous layer and the emitter layer are of different materials.

5. The solar cell of claim 4, wherein the porous layer includes at least one material selected from a group consisting of titanium oxide, silicon oxide and silicon nitride.

6. The solar cell of claim 1, wherein the first electrode electrically connected to the emitter layer and a second electrode electrically is connected to the semiconductor substrate.

7. The solar cell of claim 1, comprised of a dopant sprayed upon and stored within the porous layer and permeating the emitter layer.

8. A solar cell, comprising:
    a semiconductor substrate exhibiting a first type of conductivity;
    an emitter layer formed by a dopant, exhibiting a second and opposite type of conductivity, arranged on a front surface of the semiconductor substrate; and
    a porous layer having a closed surface structure and uniform thickness disposed to prevent solar light from being reflected from the emitter layer, the porous layer comprised of a dopant sprayed upon the porous layer, the porous layer storing the dopant, and the porous layer exhibiting an energy band gap different from said semiconductor substrate and said emitter layer, said closed surface structure has no openings or cavities on or to any surface of the porous layer; and
    a first electrode positioned on the porous layer on a side of the porous layer opposite to that of the emitter layer,
    wherein said porous layer contains a plurality of spherical structures uniformly distributed only in an interior space of the porous layer.

9. The solar cell of claim 8, further comprising:
    the first electrode electrically connected to the emitter layer; and
    a second electrode formed on a rear surface of the substrate and electrically connected to the semiconductor substrate; and
    a rear field layer formed between the rear surface of the substrate and the second electrode.

10. The solar cell of claim 8, wherein the porous layer and the emitter layer are of a same material.

11. The solar cell of claim 8, wherein the porous layer and the emitter layer are of different materials.

* * * * *